US011373839B1

United States Patent
Hlavenka et al.

(10) Patent No.: US 11,373,839 B1
(45) Date of Patent: Jun. 28, 2022

(54) METHOD AND SYSTEM FOR COMPONENT ANALYSIS OF SPECTRAL DATA

(71) Applicant: FEI Company, Hillsboro, OR (US)

(72) Inventors: Petr Hlavenka, Brno (CZ); Jan Klusacek, Brno (CZ); Ondrej Sembera, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/166,885

(22) Filed: Feb. 3, 2021

(51) Int. Cl.
*H01J 37/244* (2006.01)
*H01J 37/28* (2006.01)

(52) U.S. Cl.
CPC ............ *H01J 37/244* (2013.01); *H01J 37/28* (2013.01); *H01J 2237/2801* (2013.01); *H01J 2237/2807* (2013.01)

(58) Field of Classification Search
CPC .. H01J 37/244; H01J 37/28; H01J 2237/2801; H01J 2237/2807
See application file for complete search history.

(56) References Cited

U.S. PATENT DOCUMENTS

| | | | |
|---|---|---|---|
| 6,584,413 B1 | 6/2003 | Keenan et al. | |
| 7,225,107 B2* | 5/2007 | Buxton | G06K 9/6284 702/183 |
| 7,356,430 B2* | 4/2008 | Miguelanez | G01R 31/31707 702/108 |
| 8,000,928 B2* | 8/2011 | Scott | G05B 23/0294 702/179 |
| 8,699,022 B2* | 4/2014 | McManus | G01N 21/62 356/316 |
| 2009/0012723 A1* | 1/2009 | Treado | G16C 20/20 702/28 |
| 2012/0136581 A1* | 5/2012 | Keller | G16B 40/20 702/19 |
| 2012/0205539 A1* | 8/2012 | Hlavenka | H01J 37/244 250/307 |
| 2013/0228683 A1* | 9/2013 | Boughorbel | H01J 37/261 250/307 |
| 2014/0361165 A1* | 12/2014 | Sed'a | H01J 37/3005 250/307 |
| 2018/0365535 A1* | 12/2018 | Gesley | G06K 9/6286 |
| 2020/0393392 A1 | 12/2020 | Klusacek et al. | |
| 2021/0033548 A1* | 2/2021 | Tuma | G01N 23/2206 |

OTHER PUBLICATIONS

David M. Blei, Andrew Y. Ng, and Michael I. Jordan, Latent dirichlet allocation, Journal of Machine Learning Research, 3, Mar. 2003, pp. 993-1022.
Matthew D. Hoffman, David M. Blei, and Francis Bach, online learning for Latent Dirichlet Allocation, Proceedings of the 23rd International Conference on Neural Information Processing Systems vol. 1 (NIPS'10), 2010, Curran Associates Inc., Red Hook, NY, USA, pp. 856-864.
Matthew D. Hoffman, David M. Blei, Chong Wang, and John Paisley, stochastic variational inference, Journal of Machine Learning Research, Res. 14, 1 (May 2013), pp. 1303-1347.

* cited by examiner

*Primary Examiner* — David A Vanore

(57) ABSTRACT

Responsive to irradiation of a charged particle beam, emission from sample is acquired in the form of spectral data. The spectral data is decomposed by a machine learning estimator to abundances and spectral components based on a character of the detector. Images showing compositional information of the sample are generated based on the abundances and the spectral components.

20 Claims, 7 Drawing Sheets

US 11,373,839 B1

METHOD AND SYSTEM FOR COMPONENT ANALYSIS OF SPECTRAL DATA

FIELD OF THE INVENTION

The present description relates generally to methods and systems for processing spectral data, and more particularly, to extracting sample compositional information based on the spectral data.

BACKGROUND OF THE INVENTION

Charged particle microscopy is a well-known and increasingly important technique for imaging microscopic objects, particularly in the form of electron microscopy. Multiple types of emissions from a sample responsive to charged particle irradiation may provide structural and compositional information of the sample. For example, based on energy spectrum of the X-ray emission, energy-dispersive X-ray spectroscopy (EDS or EDX) can be used for elemental analysis or chemical characterization. Because different elements or chemicals have their characteristic energy spectra, sample composition may be estimated by comparing the EDS spectra with the characteristic energy spectra.

The EDS spectrum may be resulted of X-ray emission from multiple elements or chemicals, one method of decomposing the EDS spectrum is disclosed in U.S. Pat. No. 6,584,413B1 by Keenan et. al., wherein the spectral data is decomposed into a concentration intensity matrix and a spectral shapes matrix using multivariate spectra analysis. However, the inventors recognize that a full spectrum image of all pixels is required for the multivariate spectra analysis, which may lead to high computation intensity and long data-to-image time.

SUMMARY

In one embodiment, a method comprises irradiating a sample with a charged particle beam; acquiring a spectrum by detecting, via a detector, an emission from the sample responsive to the irradiation; and decomposing the acquired spectrum into an abundance and multiple spectral components with a machine learning estimator based on a character of the detector. In this way, images representing sample composition may be formed based on the outputs of the machine learning estimator and displayed during data acquisition. Further, instead of processing the full spectrum image, each spectrum is decomposed once being received by the machine learning estimator, the computation intensity is reduced.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION OF EMBODIMENTS

Figure 4:
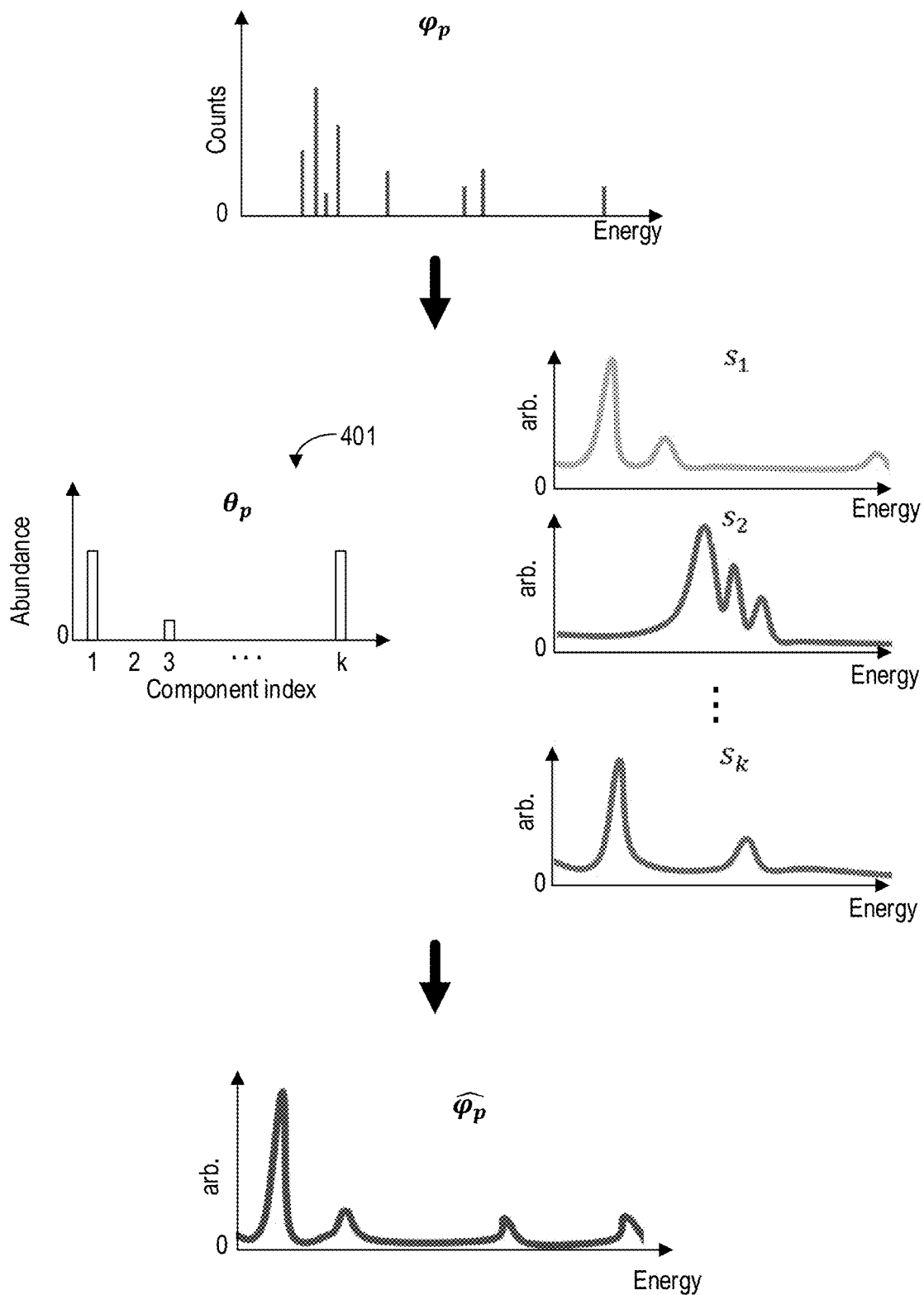
FIG. 4 illustrates data generated while analyzing the spectral data.

The following description relates to systems and methods for analyzing spectral data, such as the spectral data of energy-dispersive X-ray spectroscopy (EDS or EDX). The EDS spectra may be acquired with a charged particle microscope, such as the charged particle microscope of FIG. 1. Responsive to irradiating a sample location with the charged particle beam, such as an electron beam, emission, such as X-ray emission, from the sample is detected via an X-ray detector. The X-ray detector outputs the detected emission in the form of an energy spectrum. The energy spectrum shows number of counts (intensity) of emission at different energies. In order to obtain compositional information at the sample location, the energy spectrum is decomposed by a machine learning estimator into an abundance and multiple spectral components. As shown in FIG. 4, the abundance is a 1D array or a vector. Values of the abundance is indexed by the components. Each value of the abundance corresponds to one component and one of the multiple spectral components. Each component may correspond to an element, a mixture of elements, or a chemical phase. The number of the spectral components is the same as the number of the components. The machine learning estimator may be updated based on the decomposed results. For example, the machine learning estimator is updated based on either or both of the spectral components and the quantified spectral components. The quantifying process includes taking a spectrum as input and returns concentrations of chemical elements identified in the spectrum and corrected or quantified spectrum based on known spectra, such as the theoretical spectra of the chemical elements. A second energy spectrum acquired by irradiating a second sample location with the charged particle beam may be decomposed by the updated machine learning estimator.

The machine learning estimator decomposes the received spectra and outputs abundances and the spectral components based on the character of the detector. Before being outputted from the machine learning estimator, the spectral components may be adjusted based on the character of the detector. In one example, the adjustment is based on the energy dependent character of the detector. Due to the noise of the amplification chain and the material of the detector, the typical energy spectrum acquired by the detector, such as the EDS data, is smoother at higher energy comparing to the energy spectrum at lower energy. In other words, the peaks of the energy spectrum at lower energy is narrower than the peaks at higher energy. Through the adjustment, the spectral components output from the machine learning estimator may simulate the characteristics of the typical energy spectrum.

The machine learning estimator may be initiated based on sample information and/or known spectral components. For example, known spectral components of possible compositions of the sample may be used as the initial spectral components. In another example, one or more sample locations may be selected by an operator of the microscope, and dense spectra are acquired at the selected sample locations with long dwell time. The dense spectra may be used to initialize the estimator. As more spectra are analyzed, the machine learning estimator output may be more accurate, and the composition at more sample locations may be identified.

The machine learning estimator output, that is, abundances at the sample locations and the spectral component for each component, may be displayed directly or further analyzed to extract more information. In one example, one or more component maps are generated based on the abundances. The component maps may be displayed on a display device and updated when more spectra are analyzed. In order to reduce the data acquisition time, the dwell time of the charged particle beam at each sample location may be relatively short so that a sparse spectrum is acquired. In the sparse spectrum, one or more lower amplitude spectrum peak may be absent due to insufficient signal. The missing peaks may present in a dense spectrum that obtained with a long dwell time. In other words, the sparse spectrum may be considered as an under-sampled spectrum from the dense spectrum. In another example, abundances from multiple sample locations may be further clustered or grouped based on the similarity of the distribution of the abundances to obtain one or more phase maps, as shown in FIGS. 5A-5B and FIGS. 6A-6B. Further, dense spectra may be reconstructed based on the abundances and the spectral components generated from sparse spectrum. Quantified image showing the amount of compositions in the sample may be generated based on the reconstructed dense spectra.

The machine learning estimators for decomposing the spectral data may be constructed or developed based on a mathematical model accounting for the multinominal distribution of the spectrum. For example, the machine learning estimators may be constructed based on unsupervised learning techniques capable of component/cluster identification and characterization. These techniques may include nonnegative matrix factorization (NMF), singular value decomposition (SVD), independent component analysis (ICA), latent Dirichlet allocation (LDA) and K-means.

In one example, the machine learning estimator is constructed based on non-negative least squares method. Here, data are modeled as a superposition of the spectral components plus an additive noise and are recovered by minimizing least squares criterion. To reduce ambiguity of the solution, Dirichlet prior for abundances is assumed. To minimize the criterion, method such as ADMM (alternating direction method of multipliers) can be used.

In another example, the spectral data is modeled with LDA. The machine learning estimator is constructed based on stochastic variational Bayes inference of the LDA, as well as the character of the detector. LDA has been used for natural language processing of large documents corpora, as presented in Latent dirichlet allocation by David M. Blei, Andrew Y. Ng, and Michael I. Jordan in J. Mach. Learn, Res. 3, March 2003, 993-1022; online learning for Latent Dirichlet Allocation, by Matthew D. Hoffman, David M. Blei, and Francis Bach, 2010, in Proceedings of the 23rd International Conference on Neural Information Processing Systems Volume 1 (NIPS'10). Curran Associates Inc., Red Hook, N.Y., USA, 856-864; and stochastic variational inference, by Matthew D. Hoffman, David M. Blei, Chong Wang, and John Paisley, in Mach. Learn. Res. 14, 1 (May 2013), 1303-1347, which are incorporated here by reference. In natural language processing, LDA is used for determining the topic and topic probability of each document based on the words within the document. Herein, the LDA model is adapted to model the spectral data. Specifically, the document, the words, and the topics in natural language processing respectively correspond to the sample location, the energies of the spectrum, and the components in spectral data analysis. The energies of the energy spectrum have a multinominal distribution. The mean of the energy is a linear combination of k global basal vectors, wherein k is the number of components. Each value of the abundance is drawn from a Dirichlet distribution with a small concentration parameter as to enforce low chemical complexity of each sample location.

Figure 2A:
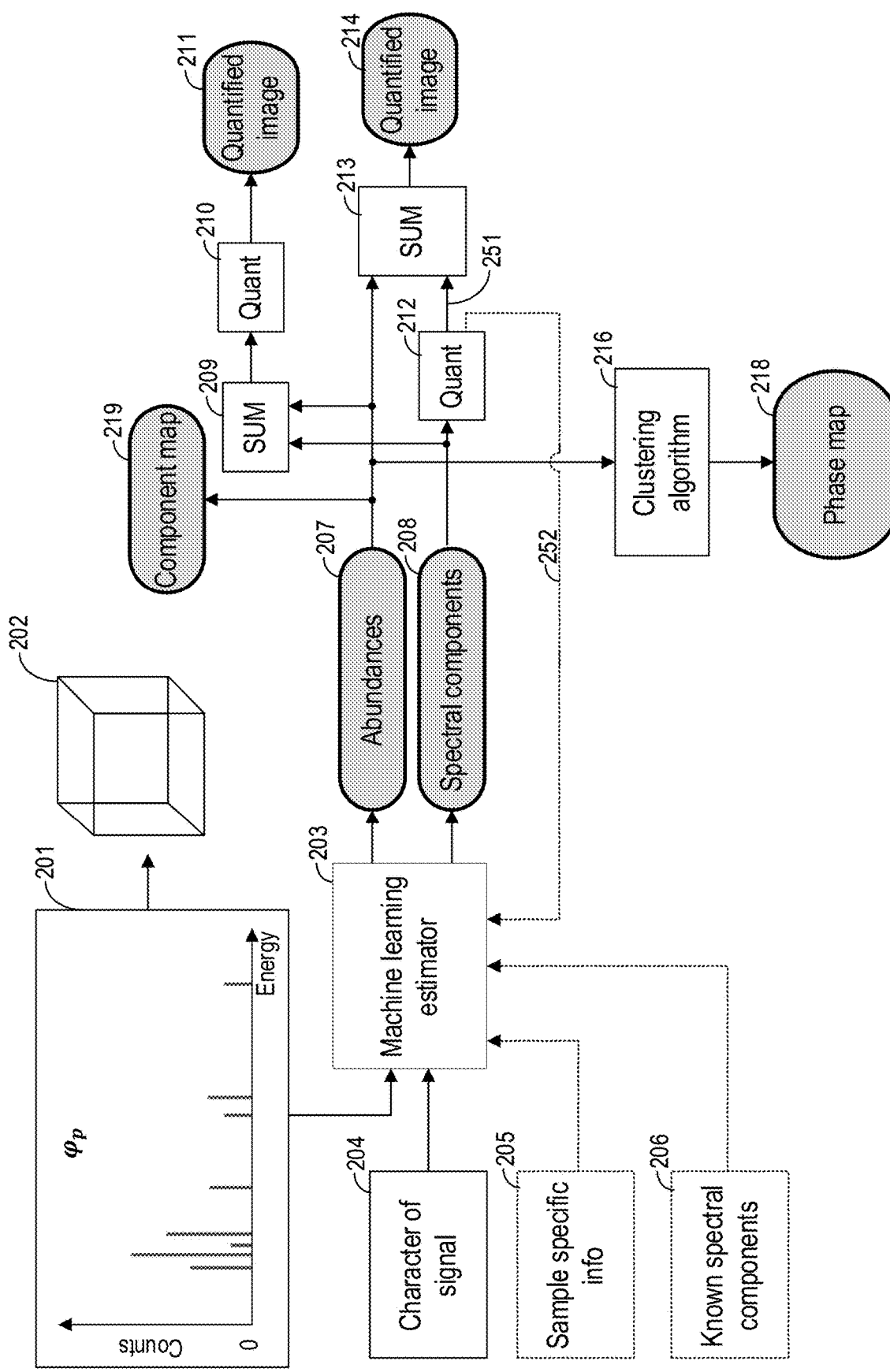
FIG. 2A illustrates the dataflow for analyzing the spectral data using a machine learning estimator.
Figure 2B:
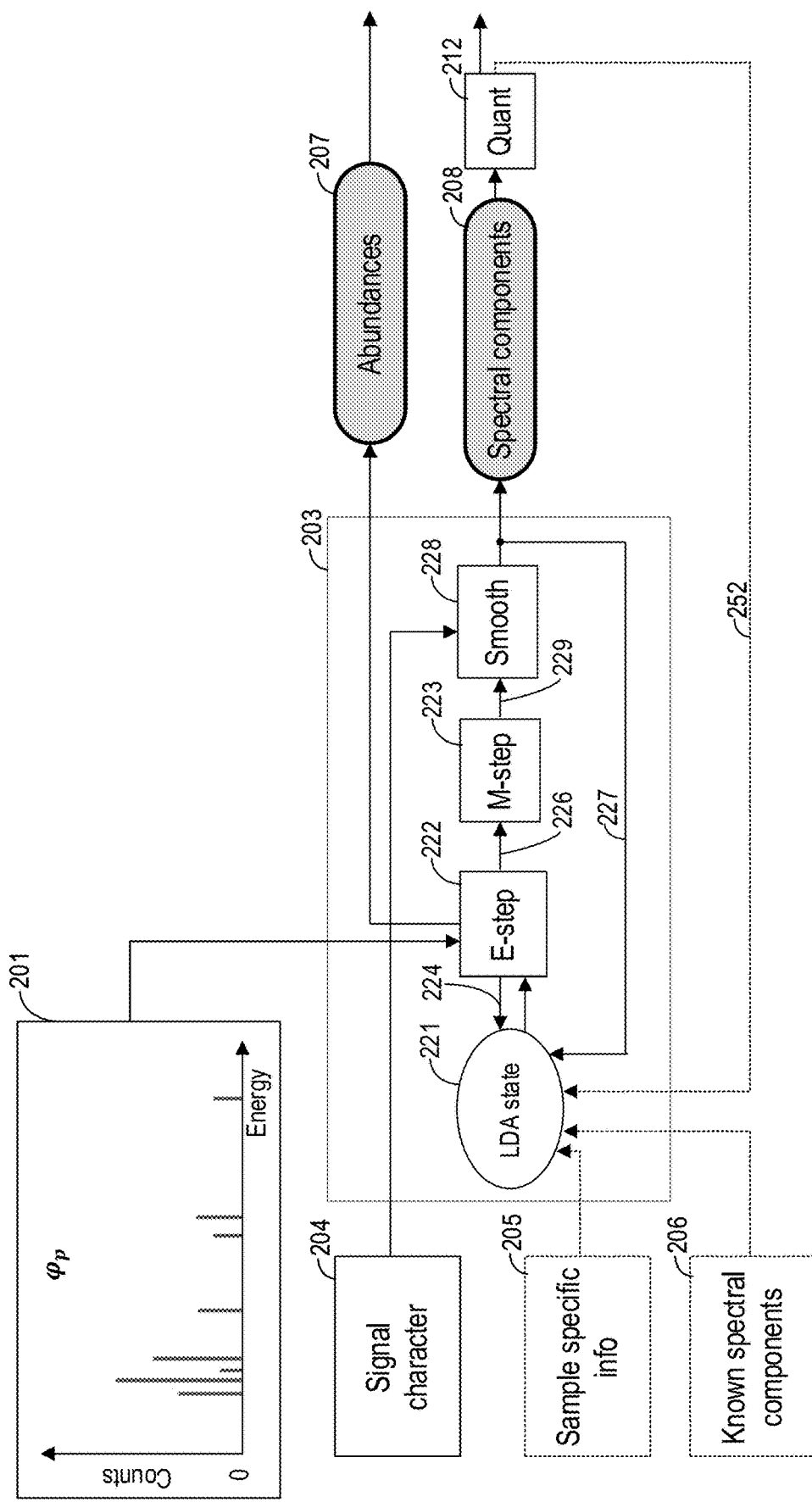
FIG. 2B illustrates the dataflow within the machine learning estimator of FIG. 2A.

In some examples, as shown in FIG. 2B, the LDA based machine learning estimator includes a LDA state, an E-step for generating abundance and updating the state variables of the LDA state, a M-step for updating the spectral components based on the updated state variables, and a smoothing step to adjust the updated spectral components based on the character of the detector. In one example, the adjustment is based on the energy dependent character of the detected emission. The adjusted component spectrum is smoother at higher energy comparing to the lower energy. The peak at lower energy is narrower than the peak at higher energy. In other words, the change rate of the adjusted component spectrum decreases with increased energy. The adjusted or smoothed spectral components may be set as current spectral components and fed back to the LDA state. Alternatively or additionally, the smoothed spectral components may be quantified based on the known spectral components before being fed back to the LDA state.

Figure 3:
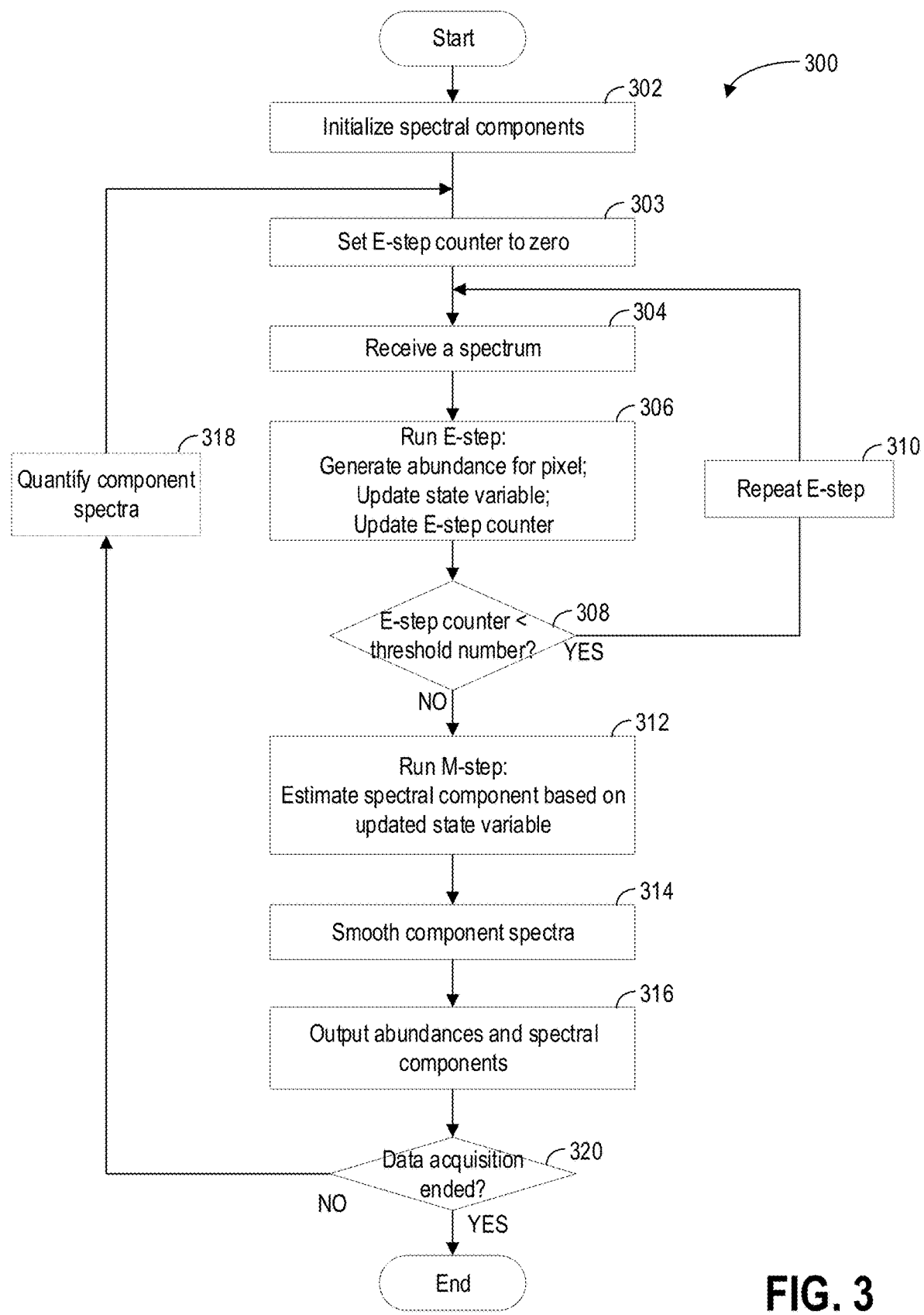
FIG. 3 shows a method of analyzing the spectral data.

As shown in FIG. 3, upon receiving each spectrum, the machine learning estimator outputs corresponding abundance and updates the state variables in the E-step. After processing a batch of spectra, the spectral components are updated based on the updated state variables in the M-step. As such, in each E-step, the state variables are updated based only on the most recently received spectrum, but not the previous acquired spectra at other sample locations. Therefore, the computation intensity is reduced comparing to the multivariate spectra analysis.

Figure 7:
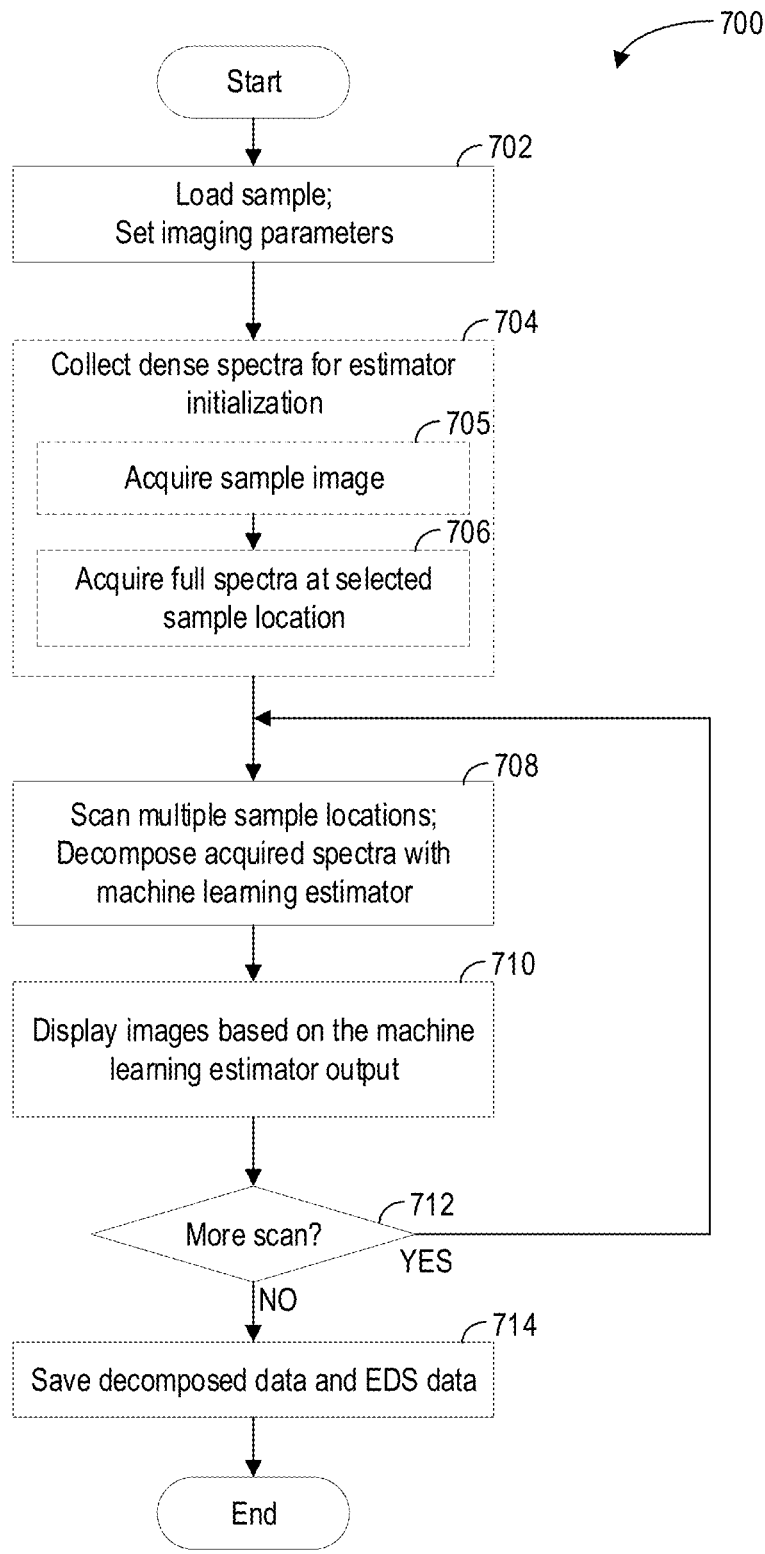
FIG. 7 is a method for acquiring and analyzing data with the charged particle microscope.

In some examples, as shown in FIG. 7, the charged particle beam is configured to repetitively scan multiple sample locations within a field of view (FOV). The charged particle beam irradiates each sample location for a dwell time. If X-ray signal is detected, the energy spectrum is sent to the machine learning estimator. Images formed based on the machine learning estimator output can be displayed in real-time, during the data acquisition process. The operator therefore can adjust or terminate the scan based on the observed the data quality.

Figure 1:
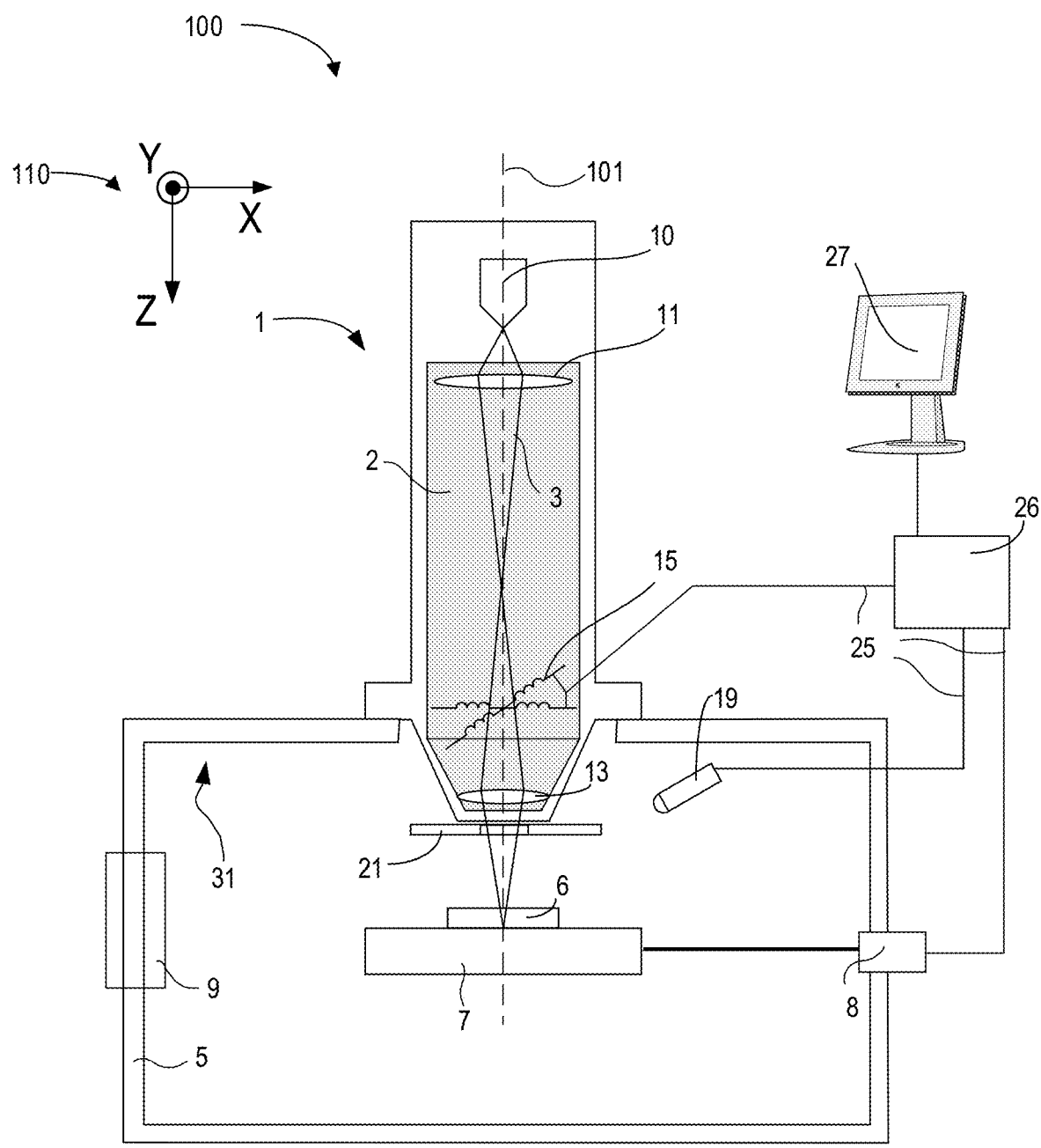
FIG. 1 illustrates a charged particle microscope.

Turning to FIG. 1, FIG. 1 is a highly schematic depiction of an embodiment of a dual-beam charged particle microscope (CPM) in which the present invention is implemented; more specifically, it shows an embodiment of a scanning electron microscopy (SEM) system. System axes are shown as axes 110. Microscope 100 comprises a particle-optical column 1, which produces a beam 3 of charged particles (in this case, an electron beam) that propagates along a particle-optical axis 101. Particle-optical axis 101 may be aligned with the Z axis of the system. The column 1 is mounted on a vacuum chamber 5, which comprises a sample holder 7 and associated actuator(s) 8 for holding/positioning a sample 6. The vacuum chamber 5 is evacuated using vacuum pumps (not depicted). Also depicted is a vacuum port 9, which may be opened to introduce/remove items (components, samples) to/from the interior of vacuum chamber 5. Microscope 100 may comprise a plurality of such ports 9, if desired.

The column 1 (in the present case) comprises an electron source 10 and an illuminator 2. This illuminator 2 comprises lenses 11 and 13 to focus the electron beam 3 onto the sample 6, and a deflection unit 15 (to perform beam steering/scanning of the beam 3). The microscope 100 further comprises a controller/computer processing apparatus 26 for controlling inter alia the deflection unit 15, lenses 11, 13 and detectors 19, 21, and displaying information gathered from the detectors 19, 21 on a display unit 27.

The detectors 19, 21 are chosen from a variety of possible detector types that can be used to examine different types of "stimulated" radiation emanating from the sample 6 in response to irradiation by the (impinging) beam 3. Detector 19 may be a solid state detector (such as a photodiode) that is used to detect cathodoluminescence emanating from the sample 6. It could alternatively be an X-ray detector, such as Silicon Drift Detector (SDD) or Silicon Lithium (Si(Li)) detector, for example. Detector 21 may be an electron detector in the form of a Solid State Photomultiplier (SSPM) or evacuated Photomultiplier Tube (PMT) for example. This can be used to detect backscattered and/or secondary electrons emanating from the sample 6. The skilled artisan will understand that many different types of detector can be chosen in a set-up such as that depicted, including, for example, an annular/segmented detector. By scanning the beam 3 over the sample 6, stimulated radiation—comprising, for example, X-rays, infrared/visible/ultraviolet light, secondary electrons (SEs) and/or backscattered electrons (BSEs)—emanates from the sample 6. Since such stimulated radiation is position-sensitive (due to said scanning motion), the information obtained from the detectors 19, 21 will also be position-dependent. This fact allows (for instance) the signal from detector 21 to be used to produce a BSE image of (part of) the sample 6, which image is basically a map of said signal as a function of scan-path position on the sample 6.

The signals from the detectors 19 and 21 pass along control lines (buses) 25, are processed by the controller 26, and displayed on display unit 27. Such processing may include operations such as combining, integrating, subtracting, false coloring, edge enhancing, and other processing known to the skilled artisan. In addition, automated recognition processes (e.g. as used for particle analysis) may be included in such processing. The controller includes a processor and a non-transitory memory for storing computer readable instructions. Methods disclosed herein may be implemented by executing the computer readable instructions in the processor.

It should be noted that many refinements and alternatives of such a setup will be known to the skilled artisan, such as the use of a controlled environment within (a relatively large volume of) the microscope 100, e.g. maintaining a background pressure of several mbar (as used in an Environmental SEM or low-pressure SEM).

Figure 5A:
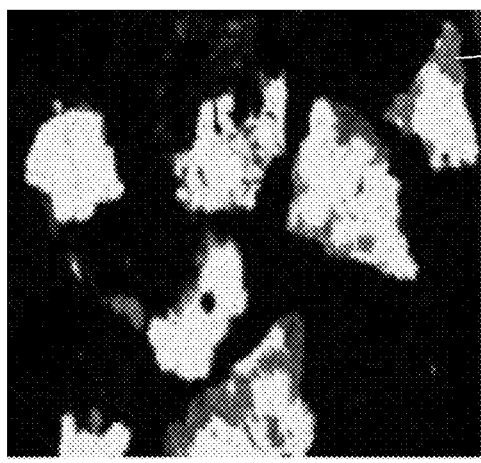
FIGS. 5A and 5B are example component maps.
Figure 5B:
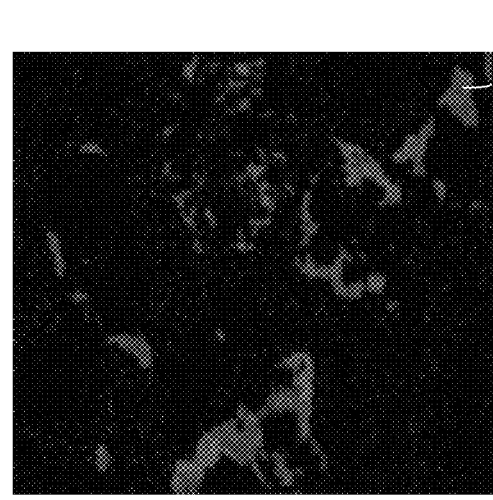

FIG. 2A illustrates the dataflow for analyzing the spectral data. The acquired spectrum 201, such as the EDS spectrum acquired by the charged particle microscope of FIG. 1 is sent to the machine and learning estimator 203. The acquired spectrum 201 may also be saved in the EDS data cube 202. The machine learning estimator 203 decomposes the received spectrum 201 into abundances 207 spectral components 208 based on known character of the detected emission 204. The machine learning estimator 203 may optionally be initialized by the sample specific information 205 and/or the known spectral components 206. The sample specific information 205 may be the possible sample composition, such as the possible elements. The machine learning estimator 203 may be initialized by the spectral components from the possible sample composition. The known spectral components 206 may be a library of spectral components. The spectral components 208 may be quantified at quantification step 212 based on the theoretical spectra of chemical elements. The quantified spectral components 252 may be fed back to the machine learning estimator 203 to update the state variables. The quantification step compares the input spectrum or spectral component with theoretical spectra of multiple chemical elements, and outputs quantified spectrum or quantified spectral component as well as the concentrations of the chemical elements in the component (or spectral component). In 212, spectral components are quantified, and concentrations 251 of elements per component and quantified spectral components 252 are outputted. The quantified image 214, showing concentrations of elements per sample location, is generated based on the concentrations 251 of elements per component and the abundances. Each pixel of the quantified image 214 may be computed by taking the combination/sum of per spectral component concentrations with weights equal to pixels abundances. For example, if the first spectral component contains Fe at concentration 0.4 and oxygen at concentration 0.6 and a second spectral component contains Si at 0.33 and oxygen O at 0.66, the deduced concentrations at the sample location (or pixel) with abundances (0.5, 0.5) would be Fe . . . 0.2, Si . . . 0.165, O . . . 0.63. The pixel value of the quantified image 214 is determined based on the deduced concentrations. Component maps 219 may be generated based on the most recent abundances of multiple sampling locations, wherein each component map shows the spatial distribution of the quantity of a particular component. FIGS. 5A and 5B are example component maps of a sample. The gray value of the pixel is a value of the abundance of the corresponding component.

Figure 6A:
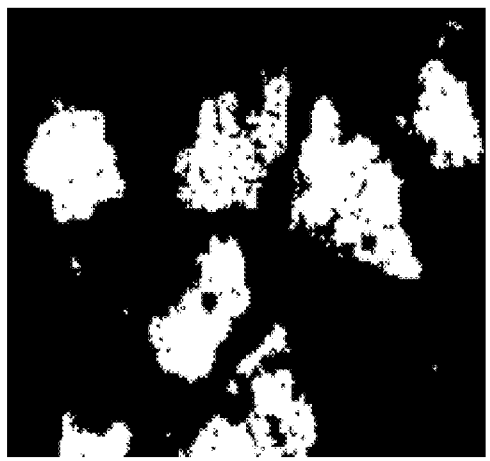
FIGS. 6A and 6B are example phase maps.
Figure 6B:
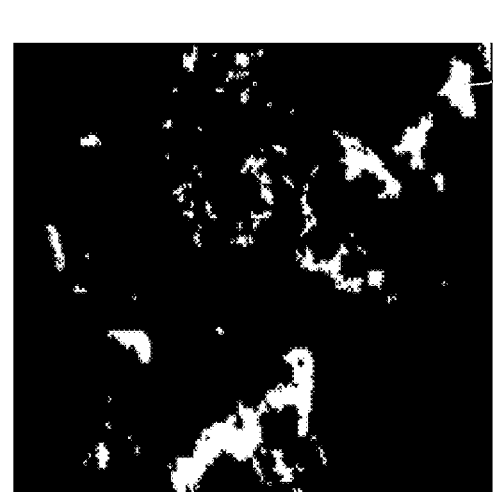

The abundances 207 and the spectral components 208 may be further analyzed to provide compositional information of the sample. In one example, the abundances 207 may be clustered at 216 to generate one or more phase map 218. The clustering algorithm 216 groups together pixels with similar abundance vector, that is, abundance vector containing spectral components in similar ratios, and assigns the same phase to each found cluster. The clustering algorithm may be K-means. The phase map has a binary contrast. That is, the each pixel of the phase map can be one of the two numbers, such as either 1 or 0. FIGS. 6A and 6B are phase maps of the same FOV as FIGS. 5A and 5B. FIGS. 5A-5B show that region 501 of the sample includes different components. Due to the similarity of abundance distribution of pixels in region 501, FIG. 6B shows that the sample at region 501 belongs to the same phase. As such, a component map shows the relative quantity of one component at each sample location, while the phase maps show the presence of the phase at each sample location. The phase may correspond to certain combination of components. In one example, each component map corresponds to one element. The phase map corresponds to a mineral with a specific combination of the elements. In some examples, multiple phase maps may be combined into one composite phase map by color coding different phases.

The concentrations 251 of chemical elements of the components associated with the spectral components 208 may be combined with the abundances at 207 at summation block 213 to obtain a quantified image 214. Alternatively, a quantified image 211 may be generated by first combining the abundances and the spectral components at summation block 209 to generate a combined spectrum, and then quantifying the combined spectrum at quantification block 210 with the known spectra of spectral components. Each pixel of quantified image 211 is generated based on the concentration of the elements outputted from quantification block 210. Comparing to the quantified image 214, the computation intensity for generating quantified image 211 is higher due to increased data size at the quantification block 210.

FIG. 2B shows dataflow within the machine learning estimator 203. In one example, the spectral data is modelled with LDA, and the machine learning estimator uses stochastic variational Bayes to perform inference for LDA model. The stochastic variational Bayes for the LDA model includes E-step and M-step, as described in Online learning for Latent Dirichlet Allocation, by Matthew D. Hoffman, David M. Blei, and Francis Bach, 2010, in Proceedings of the 23rd International Conference on Neural Information Processing Systems Volume 1 (NIPS'10). Curran Associates Inc., Red Hook, N.Y., USA, 856-864. The machine learning estimator further includes a smoothing step (or a regularization step) to enrich the LDA model based on prior information about the spectral data.

The machine learning estimator 203 includes a LDA state 221 for saving the state variables and the spectral components, an E-step and a M-step for performing the inference, and a smoothing step 228 for smoothing the estimated spectral component 229 from M-step output. The spectral components in LDA state 221 may be initiated based on sample specific information 205 or a library of known spectral components 206. The LDA state 221 outputs current state variables and current spectral components to the E-step 222 and receives updated states variables 224 generated by the E-step. The E-step generates abundance 207 for spectrum 201 based on the current spectral components. The E-step also outputs the updated state variables 226 to M-step 223. M-step estimates the spectral components based on the updated state variables and outputs the estimated spectral components 229 to the smoothing step 228. The smoothing step 228 smooths the estimated spectral components based on the character of the detector and outputs the smoothed spectral components out of the machine learning estimator 203 as spectral components 208. In one example, the smoothed spectral components are fed back to the LDA state 221 as current spectral components. Additionally, or alternatively, the smoothed spectral components are quantified at 212 before feeding back to the LDA state 221 as current spectral components.

FIG. 3 shows method 300 for decomposing the spectral data with a machine learning estimator. The spectral data may be modeled with LDA. The decomposition is based on stochastic variational Bayes applied to the LDA model, as well as the energy dependent character of the detector. Herein, before proceeding to the M-step, the E-step is repeated multiple times until sufficient number of spectra are analyzed. The E-step updates or generates the abundance of each input spectrum (corresponding to a sample location or a pixel) and updates the state variables of the LDA state. The M-step then estimates the spectral components based on the updated state variables. The estimated spectral components generated by the M-step is smoothed based on the character of the EDS data. The abundance is specific to each sample location or pixel, while the spectral components are global parameters applied to all sample locations or pixels.

At 302, the spectral components are initialized. In one example, the spectral components are randomly initialized. In another example, the spectral components are initialized based on the known spectral components. The known spectral components may be a library of known spectral component of various elements or phases. Alternatively, the known spectral components may be determined based on the possible sample composition. In yet another example, the spectral components may be initialized based on dense spectra measured from one or more sample locations.

At 303, the E-step counter is set to zero.

At 304, the machine learning estimator receives a spectrum acquired from a sample location by the detector. The spectrum may be a sparse spectrum.

At 306, the received spectrum is analyzed via an E-step. The E-step estimates the abundance of the spectrum and updates the state variables of the LDA model. For example, the abundance is computed iteratively, and the state variables are updated after abundances have converged. Further, the E-step counter is added or incremented by 1.

At 308, the E-step counter is compared with a predetermined threshold number. The threshold number may be experimentally determined. In one example, the threshold number is 200. If the E-step counter is less than the threshold number, the E-step is repeated at 310 and a new spectrum is processed. Otherwise, method 300 proceeds to M-step at 312.

At 312, during the M-step of spectral data decomposition, the spectral components are estimated or updated based on the updated state variables from 308.

At 314, the estimated spectral components from 312 are smoothed based on the energy dependent characteristic of the EDS data, which is resulted from the energy dependent character of the detector. Let J denote the number of energy bins distinguished by the detector. For each spectral component $s \in R^J$ produced by M-step at 312, the sum of the spectral component is 1. That is, $$\sum_{j=1}^{J} s_j = 1, s_j \geq 0, \forall j = 1 \ldots J, \quad \text{Equation 1}$$

wherein the energy associated with the spectral component is split into J energy bins. The energy bins are indexed with j, the larger the index, the higher the energy within the bin. The estimated spectral component may be sparse. Values of the estimated spectral component may oscillate wildly because there is no further restriction to the estimated spectral component other than Equation 1. The estimated spectral component is smoothed based on the character of the detector so that the change rate of the smoothed spectral component versus energy is less at higher energy comparing to the change rate at lower energy. In other words, the smoothed spectral component is smoother with increased energy, and the peak at a higher energy is broader than the peak at a lower energy. In one example, the estimated spectral component may be smoothed by solving:

$$y = \operatorname*{argmin}_{x} \left( \|s - x\|^2 + \lambda \sum_{j=1}^{J-1} \omega_j^2 |x_j - x_{j+1}|^2 \right), \quad \text{Equation 2}$$

wherein vector s is the spectral component prior to smoothing, vector y is the non-negative smoothed spectral component, $x_j$ is the value of spectrum x in the $j^{th}$ bin, λ relates to Fano noise and is a non-negative number controlling the strength of the smoothing, and the larger of parameter λ, the smoother of y and the further of y from s. The change rate of the smoothed spectral coefficient, which is the change of value of the adjacent bins $|x_j-x_{j+1}|$, is relatively small for each j. Coefficients $w_j$ are set to $w_j=\sqrt{w_0+J*dE}$, wherein dE is the width of the bin and $w_0$ relates to zero energy peak width. The coefficients $w_j$ have the effect that vector y has smaller variation/change at large values of j. Parameters (such as λ, $w_j$ and $w_0$) in Equation 2 depend on the character of the detector and may be different for different detector type and design. As such, peaks at lower energies of the smoothed spectral component y are narrower comparing to the peaks at higher energies. Such character of the smoothed spectral component resembles the character of the EDS data.

At 316, the abundances of the analyzed spectra and the current spectral components may be outputted from the machine learning estimator for further analysis or forming images as shown FIG. 2. In another example, the estimator outputs the abundance of each analyzed spectrum after the abundance is generated at 306, and outputs only the spectral components at 316. In yet another example, the estimator outputs the abundances and spectral components after all spectra are analyzed by the machine learning estimator.

At 320, method 300 checks whether all spectra have been analyzed. If the answer is yes, method 300 exits. Otherwise, at 318, the current component spectra may be quantified via the quantification block 212 of FIG. 2 and fed back to the LDA model for processing the next spectrum in the E-step. Alternatively, the current spectral components are used for processing the next spectrum in the E-step without being quantified.

In this way, the machine learning estimator processes the acquired spectra in batches. Within each batch, the E-step is repetitively executed, wherein each E-step run processes one spectrum. After each E-step run, the abundance of the sample location (or pixel) corresponding to the spectrum is generated. After each batch of the spectra are processed, the estimator runs M-step to estimate the spectral components related to all spectra received by the estimator. The estimated spectral components are then smoothed so that the LDA model is enriched by a prior information on the character of the EDS data. The abundances and the spectral components may be processed and displayed in real-time, during the data acquisition, in various forms as shown in FIG. 2A.

FIG. 4 illustrates the abundance $\theta_p$ and the spectral components $s_1-s_k$ derived from the spectrum $\varphi_p$ acquired by the charged particle microscope. The abundance $\theta_p$ is a vector with k values, wherein each value of the abundance corresponds to one component. Each spectral component is a vector representing the spectrum of the component. The spectral component may be normalized so that the sum of the vector is one. A predicted spectrum $\widehat{\varphi_p}$ may be formed by combining the abundances with the spectral components: $\widehat{\varphi_p}=\Sigma_k\theta_{pk}s_k$. Comparing to spectrum $\varphi_p$, the predicted spectrum has improved signal to noise ratio and may represent the most probable dense spectrum at the sample location.

FIG. 7 shows method 700 for imaging a sample with a charged particle microscope. Responsive to charged particle irradiation, emission from the sample is detected by a detector in the form of a spectrum. The acquired spectrum is decomposed by a machine learning estimator into abundances and spectral components as shown in FIG. 3. Images showing compositional information of the sample can be shown in real-time based on the machine learning estimator output.

At 702, the sample is loaded to the charged particle microscope and the imaging parameters are set. The imaging parameters may include parameters of the charged particle beam and the scan parameters. For example, one or more FOVs are selected and dwell time of the charged particle beam at each sample location when scanning the FOV may be determined. The FOV may be selected based on SEM or BSE imaging. The dwell time may be determined based on the sample type. Further, sample type or possible sample compositions may be set in the charged particle microscope by the operator for initializing the machine learning estimator.

At 704, the machine learning estimator may optionally be initialized based on one or more dense spectra collected from the sample. For example, sample image, such as SEM or BSE image, may be acquired at 705 and displayed to the operator. The operator may select one or more regions or sample locations on the sample image for collecting the dense spectra. The selected sample locations may be regions that have different sample compositions. At 706, the charged particle beam, such as the electron beam, is directed to the selected sample locations and EDS spectra are acquired. The dwell time at the selected sample locations is longer comparing to the dwell time for scanning the FOV determined at 702, so that dense spectra are acquired. The dense spectra may be used for initializing the estimator at step 302 of method 300.

At 708, multiple sample locations are repetitively scanned with the charged particle beam. If a spectrum is detected at a particular sample location, the spectrum is sent to the machine learning estimator. If a spectrum is not detected, the charged particle beam moves to the next sample location, without sending signal to the machine learning estimator. In on example, the spectrum is not detected at a sample location when the total counts from the detector output at the sample location is lower than a threshold count. Based on the received spectra, the machine learning estimator outputs an abundance for each of the analyzed spectrum and updates the spectral components after analyzing a batch of the spectra.

At 710, images showing the structural and compositional information of the sample may be displayed. For example, one or more of the component maps, spectral components, phase maps, and quantified images may be displayed based on the outputs of the machine learning estimator, as shown in FIG. 2. Step 708 and 710 may be performed in parallel so that the images are displayed during data acquisition.

At 712, method 700 checks whether more scan is needed. In one example, additional scan is not needed if the sample has been scanned for a predetermined number of times. In another example, the operator may determine whether more scan is needed based on the images displayed at 710. If more scan is needed, method 700 continues scanning the sample with the charged particle beam. Otherwise, method 700 proceeds to 714. At 714, the decomposed data from the machine learning estimator output, as well as the EDS data cube, are saved.

In this way, images representing sample composition may be formed and displayed in real time based on the decomposed data. The technical effect of modeling the spectral data using the LDA is that the LDA model accounts for the multinominal distribution of the spectrum. The technical effect of smoothing the spectra component based on the known character of the spectral data is to adjust the inference for LDA to generate spectral components resembling the character of the spectral data. The technical effect of outputting the abundances and the spectral components after processing a batch of received spectra is that compositional sample images can be displayed during data acquisition. Further, the computation intensity is reduced.

What is claimed is:

1. A method, comprising:
   irradiating a sample with a charged particle beam;
   acquiring a spectrum by detecting, via a detector, an emission from the sample responsive to the irradiation; and
   processing the spectrum by executing computer readable instructions in a processor, wherein processing the spectrum includes utilizing a machine learning estimator to decompose the acquired spectrum into an abundance and multiple spectral components based on a character of the detector.

2. The method of claim 1, wherein the machine learning estimator is developed based on a mathematical model accounting for a multinominal distribution of the spectrum.

3. The method of claim 1, further comprising:
   updating the machine learning estimator based on the multiple spectral components;
   acquiring a second spectrum by detecting, via the detector, the emission from the sample; and
   decomposing the acquired second spectrum with the updated machine learning estimator based on the character of the detector.

4. The method of claim 1, wherein the spectrum is an energy spectrum, and wherein decomposing the acquired spectrum based on the character of the detector includes smoothing each of the multiple spectral components based on an energy dependent character of the detector.

5. The method of claim 4, wherein the energy dependent character of the detector includes a peak of the detected emission at a lower energy is narrower than a peak of the detected emission at a higher energy.

6. The method of claim 1, wherein the abundance is a 1D array, and each value of the abundance corresponds to a component and a spectral component of the multiple spectral components.

7. The method of claim 1, wherein the acquired spectrum is modeled with Latent Dirichlet Allocation, and the machine learning estimator is constructed based on stochastic variational Bayes inference.

8. The method of claim 1, further comprising initializing the machine learning estimator with multiple known spectral components.

9. The method of claim 8, further comprising:
   selecting one or more sample locations;
   irradiating the selected locations with the charged particle beam and acquiring one or more dense spectra, wherein a dwell time for acquiring the dense spectra is longer than a dwell time for acquiring the spectrum; and
   determining the known spectral components based on the one or more dense spectra.

10. The method of claim 8, further comprising determining the known spectral components based on a sample composition.

11. The method of claim 1, further comprising:
    quantifying one or more of the multiple spectral components based on theoretical spectra of chemical elements;
    updating the machine learning estimator based on the quantified spectral components;
    acquiring a second spectrum by detecting the emission from the sample; and
    decomposing the acquired second spectrum with the updated machine learning estimator and the character of the detector.

12. A method, comprising:
    repetitively scanning multiple sample locations of a sample with a charged particle beam;
    acquiring multiple spectra responsive to detecting, via a detector, emissions from the multiple sample locations; and
    processing the spectrum by a controller including a processor and a non-transitory memory, wherein processing the spectrum includes utilizing a machine learning estimator to decompose the acquired spectra into abundances and multiple spectral components based on a character of the detector, wherein each spectrum of the acquired multiple spectra corresponds to one of the abundances.

13. The method of claim 12, wherein the acquired multiple spectra are modeled with Latent Dirichlet Allocation (LDA), and the method further comprising:
    updating state variables of the LDA model with each of the acquired multiple spectra; and
    updating the multiple spectral components after updating the state variables for a predetermined number of times.

14. The method of claim 12, the method further comprising: generating one or more component maps of the sample, wherein each component map is generated based on values in the abundances corresponding to a component.

15. The method of claim 12, further comprising clustering the abundances into one or more phases; and generating one or more phase maps based on the clustered abundances.

16. The method of claim 12, further comprising generating concentrations of chemical elements corresponding to each spectral component of the multiple spectral components by quantifying the multiple spectral components based on theoretical spectra of chemical elements, and determining concentrations of chemical elements at each sample location of the multiple sample locations by combining the concentrations of chemical elements of the multiple spectral components and the abundances of the sample location.

17. The method of claim 12, wherein the multiple spectral components are smoothed based on the character of the detector, and the method further comprising updating the machine learning estimator based on the multiple spectral components.

18. A charged particle microscope, comprising:
    a source for generating a charged particle beam;
    a scanner for scanning the charged particle beam over a sample;
    a detector for detecting an emission from the sample responsive to the charged particle beam irradiating the sample;
    a controller including a non-transitory memory for storing computer readable instructions that when executed, causes the charged particle microscope to:
    irradiate the sample with the charged particle beam;
    acquire a spectrum based on the detected emission from the sample via the detector; and
    process the spectrum by the controller, wherein process the spectrum includes utilize a machine learning estimator to decompose the acquired spectrum into an abundance and multiple spectral components based on a character of the detector.

19. The charged particle microscope of claim 18, where the source is an electron source and the detector is a X-ray detector.

20. The charged particle microscope of claim 18, wherein the machine learning estimator is based on stochastic variational Bayes inference for Latent Dirichlet Allocation (LDA), and the charged particle microscope is further configured to:
  update the machine learning estimator based on the multiple spectral components;
  acquire a second spectrum by detecting the emission from the sample; and
  decompose the acquired second spectrum with the updated machine learning estimator.

* * * * *